(12) United States Patent
Gibala et al.

(10) Patent No.: US 8,065,099 B2
(45) Date of Patent: Nov. 22, 2011

(54) POWER DISTRIBUTION MONITORING SYSTEM AND METHOD

(75) Inventors: Jeffrey A. Gibala, North Huntingdon, PA (US); Regis J. Nero, Export, PA (US); Steven P. Day, Zelienople, PA (US); Matthew G. Cimbala, Saxonburg, PA (US); Roger A. Smith, Gibsonia, PA (US)

(73) Assignee: Tollgrade Communications, Inc., Cranberry Township, PA (US)

( * ) Notice: Subject to any disclaimer, the term of this patent is extended or adjusted under 35 U.S.C. 154(b) by 416 days.

(21) Appl. No.: 12/341,300

(22) Filed: Dec. 22, 2008

(65) Prior Publication Data

US 2009/0240449 A1 Sep. 24, 2009

Related U.S. Application Data

(60) Provisional application No. 61/015,289, filed on Dec. 20, 2007.

(51) Int. Cl.
*G01R 21/00* (2006.01)
*H04B 3/00* (2006.01)
*H04B 7/212* (2006.01)

(52) U.S. Cl. ............... 702/62; 340/5.9; 370/442
(58) Field of Classification Search ............ 702/62, 702/188; 340/662, 657, 5.9; 370/442, 447
See application file for complete search history.

(56) References Cited

U.S. PATENT DOCUMENTS

| | | | |
|---|---|---|---|
| 6,437,692 B1 | 8/2002 | Petite et al. | |
| 6,452,482 B1 | 9/2002 | Cern | |
| 6,771,078 B1 | 8/2004 | McCauley et al. | |
| 6,809,633 B2 | 10/2004 | Cern | |
| 6,828,770 B1 | 12/2004 | McCauley et al. | |
| 6,844,810 B2 | 1/2005 | Cern | |
| 6,897,764 B2 | 5/2005 | Cern | |
| 6,975,210 B2 | 12/2005 | Cern | |
| 7,005,943 B2 | 2/2006 | Cern | |
| 7,053,767 B2 | 5/2006 | Petite et al. | |
| 7,058,524 B2* | 6/2006 | Hayes et al. | ........ 702/62 |
| 7,061,370 B2 | 6/2006 | Cern | |
| 7,078,996 B1 | 7/2006 | Cern et al. | |

(Continued)

FOREIGN PATENT DOCUMENTS

WO 0109628 A1 2/2001

OTHER PUBLICATIONS

Gridsense Inc., Sep. 22, 2006, 4 pages, http://www.gridsense.net/products_It40.shtml.

(Continued)

*Primary Examiner* — Bryan Bui
(74) *Attorney, Agent, or Firm* — The Webb Law Firm

(57) ABSTRACT

A power distribution monitoring system includes a number of power line mounted monitors. Each monitor can acquire data regarding the delivery of electrical power in the power line, wirelessly transmit and receive messages, and electromagnetically acquire and store operating electrical power from electrical current flowing in the power line. The system also includes an aggregator that can wirelessly transmit and receive messages and wirelessly output beacon messages. In response to beacon signals wirelessly output by the aggregator, each monitor co-acts with the aggregator to dynamically build a wireless communication network for the wireless communication of the data acquired by the monitor regarding the delivery of electrical power in the power line to the aggregator.

20 Claims, 6 Drawing Sheets

U.S. PATENT DOCUMENTS

| | | |
|---|---|---|
| 7,109,835 B2 | 9/2006 | Cern |
| 7,116,007 B2 | 10/2006 | Cern |
| 7,148,799 B2 | 12/2006 | Cern et al. |
| 7,154,382 B2 | 12/2006 | Cern |
| 7,158,003 B2 | 1/2007 | Cern et al. |
| 7,170,367 B2 | 1/2007 | Cern |
| 7,215,233 B2 | 5/2007 | Cern et al. |
| 7,468,661 B2 | 12/2008 | Petite et al. |
| 7,593,422 B2 * | 9/2009 | Shvodian ............... 370/442 |
| 2002/0105413 A1 | 8/2002 | Cern et al. |
| 2003/0160684 A1 | 8/2003 | Cern |
| 2003/0201873 A1 | 10/2003 | Cern |
| 2003/0210135 A1 | 11/2003 | Cern |
| 2003/0222748 A1 | 12/2003 | Cern et al. |
| 2004/0085171 A1 | 5/2004 | Cern |
| 2004/0090284 A1 | 5/2004 | Cern |
| 2004/0104798 A1 | 6/2004 | Cern |
| 2005/0062589 A1 | 3/2005 | Cern |
| 2005/0068020 A1 | 3/2005 | Sweeting |
| 2005/0077868 A1 | 4/2005 | Cern et al. |
| 2006/0008204 A1 | 1/2006 | Cern |
| 2006/0087382 A1 | 4/2006 | Cern |
| 2006/0261920 A1 | 11/2006 | Cern et al. |
| 2006/0268487 A1 | 11/2006 | Cern |

OTHER PUBLICATIONS

Gridsense Inc., Oct. 26, 2007, 1 page, http://www.gridsense.net/.

* cited by examiner

POWER DISTRIBUTION MONITORING SYSTEM AND METHOD

CROSS-REFERENCE TO RELATED APPLICATION

The present application claims priority from U.S. Provisional Patent Application No. 61/015,289, filed Dec. 20, 2007, which is incorporated herein by reference.

BACKGROUND OF THE INVENTION

1. Field of the Invention

The present invention relates to an intelligent electrical distribution grid monitoring system and method that includes a network of sensors that communicate via auto discovery and mesh technology. Each sensor is inductively powered from the electrical conductor and adaptively communicates via a radio, via the electrical conductor, or both simultaneously.

2. Description of Related Art

The electric distribution grid in North America is characterized by aging infrastructure and outdated technology at a time when digital society demands an increased quantity and more reliable electrical power. As the investment cycle within the electricity distribution industry reaches a critical juncture for reinvestment in and optimization of the existing infrastructure, there is enormous pent-up demand to apply computer and electronics technologies in an industrial sector that has lagged the advancements made in the telecommunications, medical, aerospace and manufacturing industries.

Very little automation or monitoring typically exists between the customer meter and an electrical substation, making it difficult to quickly identify the cause and location of an electrical distribution problem, e.g., an outage, without manual dispatch of field crews. Additionally, planning and maintenance engineers in the electric utilities typically have limited information about the behavior of a circuit to drive the best decisions for circuit upgrade/rehabilitation tasks, and determining upgrade or replacement of equipment.

An electric utility may have Supervisory Control and Data Acquisition (SCADA) capability allowing it to have centralized remote monitoring of circuit load immediately exiting the substation and perhaps a midpoint circuit reading. Very few electric utilities have widely deployed SCADA systems, and those that do are only provided with circuit level information (entire circuit faulted and open) and cannot discern a fault location along the many miles a circuit typically spans. The utility depends on notification to their call center from customers to determine the location of damaged equipment during a power outage. Additionally, they will usually call customers to confirm restoration of power.

Electrical distribution circuits are prone to temporary faults such as nearby lightning strikes, wind-borne debris, small animals climbing insulators, and the like. With a conventional circuit breaker or fuse, a transient fault opens the breaker or blows the fuse, de-energizing the line until a technician manually recloses the circuit breaker or replaces the blown fuse. Automatic reclosing devices (autoreclosers) often make several pre-programmed attempts to re-energize the line. If the transient fault clears, the circuit breaker will remain closed and normal operation of the power line will resume. If the fault is permanent (downed wires, tree branches lying on the wires, etc.) the autorecloser will exhaust its pre-programmed attempts to re-energize the line and remain tripped off until manually commanded to try again. Ninety percent of faults on overhead power lines are transient and can be cleared by autoreclosing, resulting in increased reliability of supply.

Repeated manual closings into a permanent fault stress the circuit components, but this troubleshooting method is frequently employed by technicians.

If the fault cannot be cleared by automated or manual closing into the fault, the next option is to send a troubleshooter into the field to identify where the problem/fault is located. If the troubleshooter can fix the problem upon arrival they will. If additional crews are required, the troubleshooter notifies the Operations Center dispatcher to send the appropriate crew (tree crew, underground crew, substation crew, etc). When this situation exists, outage duration usually exceeds the 2 hour tolerance level of most customers. Service restoration is confirmed at the Operations Center via SCADA, through the automated distribution system, or by contacting customers. Currently, no automated system notification of power restoration exists throughout the distribution system.

Additional devices may provide information on the location of a fault. So-called Fault Circuit Indicators (FCIs) have been used to identify when they have experienced a fault. FCIs are stand-alone devices and require visual inspection to determine their status via driving by the FCI location and looking for a color coded or blinking lighted indicator.

SUMMARY OF THE INVENTION

Disclosed is a remote monitoring system designed to serve the unmet need within electric utilities for low cost, system-wide, continuous monitoring of distribution circuits from 4,000 to 69,000 volts. This system makes use of radio frequency (RF) communications for bi-directional communications to a centralized system via a dynamic wireless mesh network that handles many-to-many connections. The system is also capable of dynamically updating and optimizing these connections. Additionally, the design of the system minimizes total cost of ownership and make-ready costs on the part of the electric utility by drawing its power inductively from the electrical distribution line, along with the ability to store energy to retain communicated outage information.

The system provides a near real time view of the status of distribution circuits enabling the electric utility to accurately locate a faulted element. This capability is at a much greater level of detail than that provided by SCADA systems and does not require visual inspection in the field, as Fault Circuit Indicator (FCI) devices do. The system provides reductions in the time to find the root cause of problems and dispatch repair crews to the correct location. Reduction of Mean Time to Repair (MTTR) has a direct impact on system and circuit reliability as tracked by the utility and reported to the Public Utility Commission.

The system is distinguished by the use a mesh protocol designed for sensor (MMP) overlay. A hybrid mesh approach allows the MMPs to communicate either over the air (RF) or over the electrical conductor using power line carrier communications (PLCC) technology. The exact means of communication is chosen dynamically and optimized, allowing for increased overall communication reliability and redundancy.

Furthermore, the MMPs store power via a Super Capacitor to allow operation for some time following a power outage. A common internal device is used to both power the device from the electrical conductor and to provide measurements.

Finally, the system enables practical, cost-effective monitoring, as it requires minimal planning and engineering to install, does not consume any pole space, installs easily, is maintenance free and self identifies and connects to the mesh network upon installation.

More specifically, the invention is a power distribution monitoring system. The system includes at least one power line mounted monitor including means for acquiring data regarding the delivery of electrical power in the power line, means for wirelessly transmitting and receiving messages, and means for electromagnetically acquiring operating electrical power from electrical current flowing in the power line; and an aggregator including means for wirelessly transmitting and receiving messages, said aggregator operative for wirelessly outputting beacon messages and for receiving monitor initiated messages wirelessly transmitted from each monitor, wherein, upon initially acquiring operating electrical power from electrical current flowing in the power line, each monitor is responsive to at least one of the beacon messages for wirelessly transmitting a first monitor initiated message to the aggregator which responds to the first monitor initiated message by wirelessly transmitting to the monitor a first aggregator initiated message that includes an assignment of the monitor to a unique communication slot of time of a time-based communication protocol that the monitor utilizes thereafter for wirelessly communicating subsequent monitor initiated messages to the aggregator.

At least a subset of the monitor initiated messages can include the data regarding the delivery of electrical power in the power line.

The time-based communication protocol can include an first block of time slots and a second block of time slots. When initially powered with electrical power acquired from the power line, each monitor can wirelessly transmit its first monitor initiated message during one of the time slots of the first block of time slots. The unique communication time slot can be a unique time slot in the second block of time slots.

Upon initially being powered, each monitor can be operative for randomly picking a slot of time in the first block of time slots for wirelessly transmitting the first monitor initiated message to the aggregator in response to receiving the beacon message.

The system can further include at least one intermediate monitor for storing and retransmitting messages inbound to the aggregator from the monitor or outbound from the aggregator to the monitor during a unique communication time slot assigned to the intermediate monitor by the aggregator.

Each intermediate monitor can includes a routing table. The routing table can include an identity of either the aggregator or another intermediate monitor to which the intermediate monitor retransmits aggregator bound messages. The routing table can include an identity of another monitor to which the intermediate monitor retransmits aggregator initiated messages.

The routing table can include for aggregator bound messages the identity of (1) two other monitors or (2) the aggregator from which the intermediate monitor can select to retransmit messages. The routing table can include for aggregator initiated messages the identity of two other monitors from which the intermediate monitor can select to retransmit messages. The intermediate monitor can be operative for making each selection based on a path quality rating associated with the identity.

The path quality rating can be based on a number of intermediate monitors in a path to the aggregator for aggregator bound messages or a number of intermediate monitors in a path to a endpoint monitor for aggregator initiated messages and/or a weakest signal strength along the path to the aggregator or the path to the endpoint monitor.

In response to detecting a loss of electrical power being delivered in the power line, each monitor can include in a message wirelessly output during its unique communication time slot data indicative of said power loss.

When not wirelessly communicating during its unique communication time slot, each monitor can receive messages output by at least one of the following: the aggregator or at least one other monitor.

Each monitor can include a two-section magnetic core that is separated during installation of the monitor on the power line and brought together around the power line to compete a magnetic circuit and to mechanically couple the monitor to the power line, wherein the completed magnetic circuit is operable to electromagnetically acquire the electrical power from the electrical current flowing in the power line.

The means for acquiring data regarding the delivery of electrical power in the power line can include at least one of the following: a sense resistor operative for outputting a voltage related to the electrical current flowing in the power line; a surge current sensor operative for detecting a peak magnitude of the electrical current flowing in the power line; and a Hall sensor operative for detecting the electrical current flowing in the power line.

Each monitor can include a controller operatively coupled to receive data from the means for acquiring data.

Each means for wirelessly transmitting and receiving messages can include an RF transceiver operating under the control of a controller.

The aggregator can operative for measuring zero voltage crossing on the power line and for synchronizing each means for wirelessly transmitting and receiving messages to said zero voltage crossing. Each monitor can be operative for measuring zero current crossing in the power line and for determining a phase difference between the zero voltage crossing and the zero current crossing based on a time difference between said synchronization and the time the monitor measures zero current crossing.

The invention is also a power distribution monitoring system. The system includes a plurality of power line mounted monitors each of which includes means for acquiring data regarding the delivery of electrical power in the power line, means for wirelessly transmitting and receiving messages, means for controlling the operation of the monitor, and means for electromagnetically acquiring and storing operating electrical power from electrical current flowing in the power line; and an aggregator including means for wirelessly transmitting and receiving messages, and means for controlling the operation of the aggregator, wherein under the control of beacon signals wirelessly output by the aggregator, each monitor co-acts with the aggregator to dynamically build a wireless communication network for the wireless communication of the data acquired by the monitor regarding the delivery of electrical power in the power line to the aggregator.

In response to receiving a beacon message output by the aggregator after initially acquiring operating electrical power from electrical current flowing in the power line, each monitor can wirelessly communicate with the aggregator and can be assigned thereby a unique communication time slot in a time-based communication protocol that the monitor utilizes thereafter for wirelessly communicating with the aggregator.

When not wirelessly communicating during its unique communication time slot, each monitor can be operative for receiving and storing one or more message output by at least one of the following: the aggregator or at least one other monitor. The monitor can be operative for forwarding the stored one or more messages during its unique communication time slot.

The aggregator can include means for measuring zero voltage crossing on the power line and for synchronizing each means for wirelessly transmitting and receiving messages to said zero voltage crossing. Each monitor can be operative for measuring zero current crossing in the power line and for determining a phase difference between the zero voltage crossing and the zero current crossing based on a time difference between said synchronization and the time the monitor measures zero current crossing.

Each monitor can wirelessly communicate with the aggregator, and vice versa, either directly or via another monitor.

DETAILED DESCRIPTION OF THE PREFERRED EMBODIMENT(S)

Figure 1:
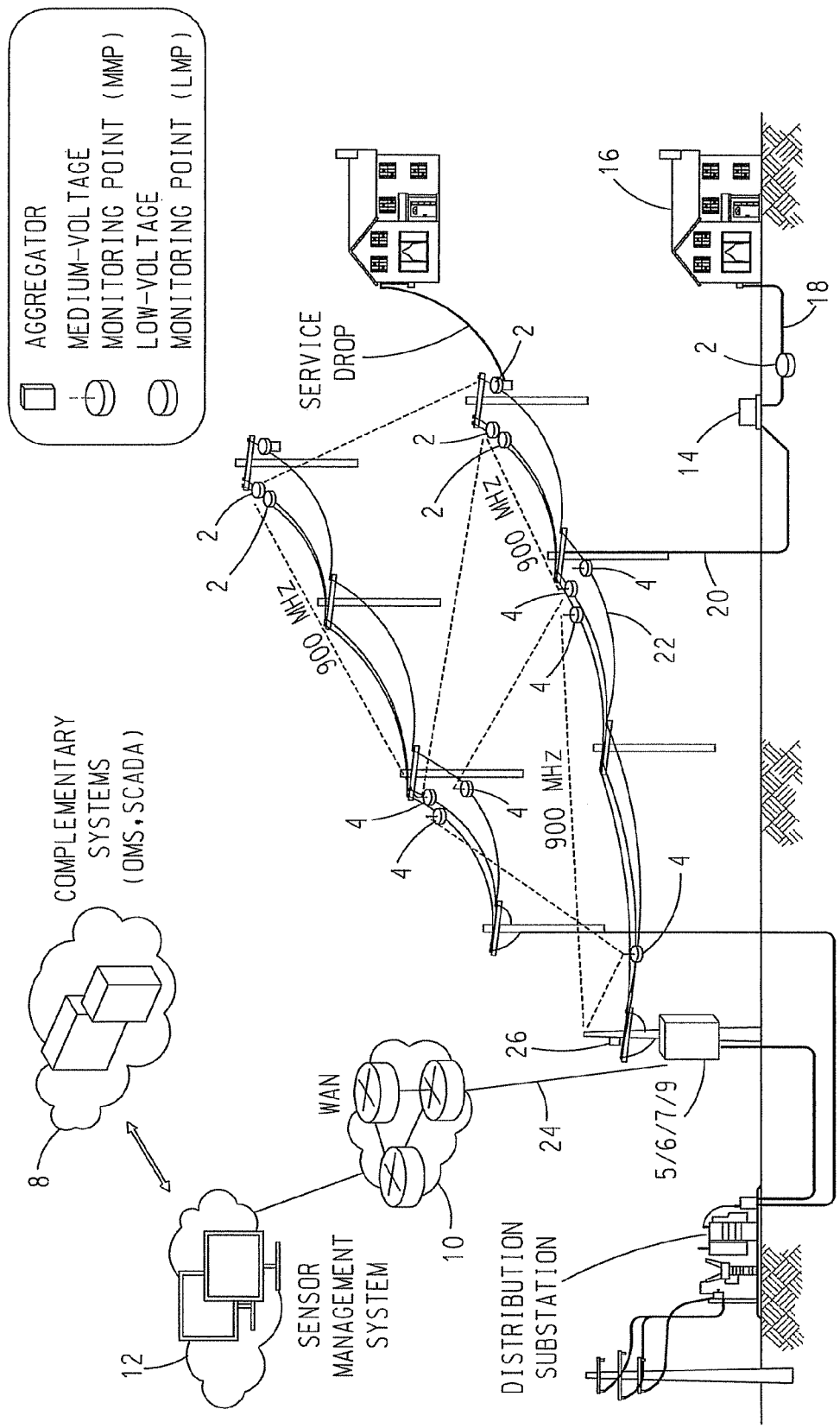
FIG. 1 is generalized schematic drawing of a power distribution monitoring system in accordance with the present invention.

With reference to FIG. 1, a power distribution monitoring system includes distribution line sensors and supporting elements, which form an integrated wireless communication network to transport data from the field to a central location via a flexible backhaul (communication) means. The system dynamically forms its own wireless communication network, to easily build out monitoring capability across a distribution system, and can readily overcome obstacles and interferences to easily grow and expand. The system includes sensors that communicate wirelessly to an aggregation point which bridges the wireless communication network to a point of backhaul (communication) into the utility's network.

The system desirably uses a 900 MHz mesh for wireless communications among sensors. However, this is not to be construed as limiting the invention. A radio transceiver (RT) is implemented in a modular fashion in each sensor to allow future incorporation of alternate RF frequencies and technologies.

An overall architecture of the system is shown in FIG. 1. The system includes one or more Low-Voltage Monitoring Point (LMP) sensors 2 and one or more Medium-Voltage Monitoring Point (MMP) sensors 4 for monitoring low and medium voltage circuits, respectively, an aggregation/backhaul (communication) device (aggregator) 6, and software that interfaces the system to one or more complementary systems 8, such as, without limitation, SCADA, via, for example, without limitation, a Wide Area Network (WAN) 10 and a sensor management system 12. However, the use of WAN 10 and sensor management system 12 between Aggregator 6 and the one or more complementary systems 8 is not to be construed as limiting the invention since it is envisioned that any suitable and/or desirable wired and/or wireless network can be utilized to facilitate communication between Aggregator 6 and the one or more complementary systems 8.

With continuing reference to FIG. 1, a Low Voltage Monitoring Point (LMP) is a sensor that is installed on the low voltage side of a pad mounted transformer 14, like a pad mounted transformer that is typically deployed on a concrete pad adjacent one or more residences 16 in the U.S. for providing residential electrical power to the one or more residences, to isolate faults within an Underground Residential Distribution (URD) network 18 that runs between transformer 14 and each residence 16 serviced thereby. Key features of an LMP 2 include:

Communicates to closest MMP 4 via narrowband power line carrier communications (PLCC) technology over a power line 20 that extends between the LMP 2 and the MMP 4;

Measures phase, voltage and current of the power line 20; and

Identifies progressive URD failure via detecting Partial Discharge which can lead to insulation breakdown.

A Medium-Voltage Monitoring Point (MMP) 4 clamps to a medium voltage power line 22 using a standard (so-called) hot stick. Key features of each MMP 4 include:

Operates on a medium-voltage power line 22 operating in the range between 4 KV and 69 KV;

Attaches to power line 22 using a standard hot stick;

Retains the geographic (longitude and latitude) coordinates of its installation which can be programmed into the MMP 4 at a suitable time or the MMP 4 can include a GPS receiver which enables MMP 4 to determining its geographic coordinates dynamically;

Communicates to an associated Aggregator 6 via wireless communication utilizing a mesh protocol to be described hereinafter;

Acquires it operating power via inductive/electromagnetic coupling to power line 22;

Includes capacitors, e.g., Super Cap capacitors, for energy storage and "last gasp" functioning during power failure events; and Measures: nominal current, surge and fault current, current phase, relative voltage, power line temperature, and harmonics.

Aggregator 6 acts as a so-called bridge between wireless communication network formed by one or more MMP's 4 in communication with Aggregator 6 and one or more complementary systems 8, such as, without limitation, SCADA. Aggregator 6 is desirably mounted at a location where it can be coupled to multiple communications mediums 24 (e.g., fiber, wireless, standard 10/100BaseT Ethernet) for communication with the one or more complementary systems 8. Key features of Aggregator 6 include:

Powered via connection to low-voltage side of co-located power-line transformer 26;

Includes means 5 for detecting zero voltage crossing on power line 22;

Battery backed for "last gasp" communications in the event of a power failure event;

An RF wireless transceiver for wireless communication with all associated MMPs 4;

Performs management and sanity functions for connected MMPs 4; and

Includes a controller 9 for controlling all of its functions.

Sensor Management System, 12 can be Aggregator's 6 point of interface to one or more complementary systems 8 within the utility. A simple Geographic Information System (GIS)-based user interface can be provided that places Aggregator 6 in a geographical space and allows click-through interface to interrogate the measurement values of an individual MMP 4 or LMP 2. Sensor Management System 12 is a server-based system that includes software that:

Monitors the health and status of all MMPs 4 and LMPs 2 in communication with Aggregator 6;

Supports automatic updates and firmware downloads to MMPs 4 and LMPs 2;

Continuously monitors communications status of MMPs 4 and LMPs 2;

Provides alerts/alarms for any MMPs 4 and LMPs 2 problems; and

Support an Application Programming Interface (API) for presentation of MMPs 4 and LMPs 2 data to one or more complementary systems 8, such as, without limitation, SCADA and so-called Outage Management System (OMS).

Figure 2:
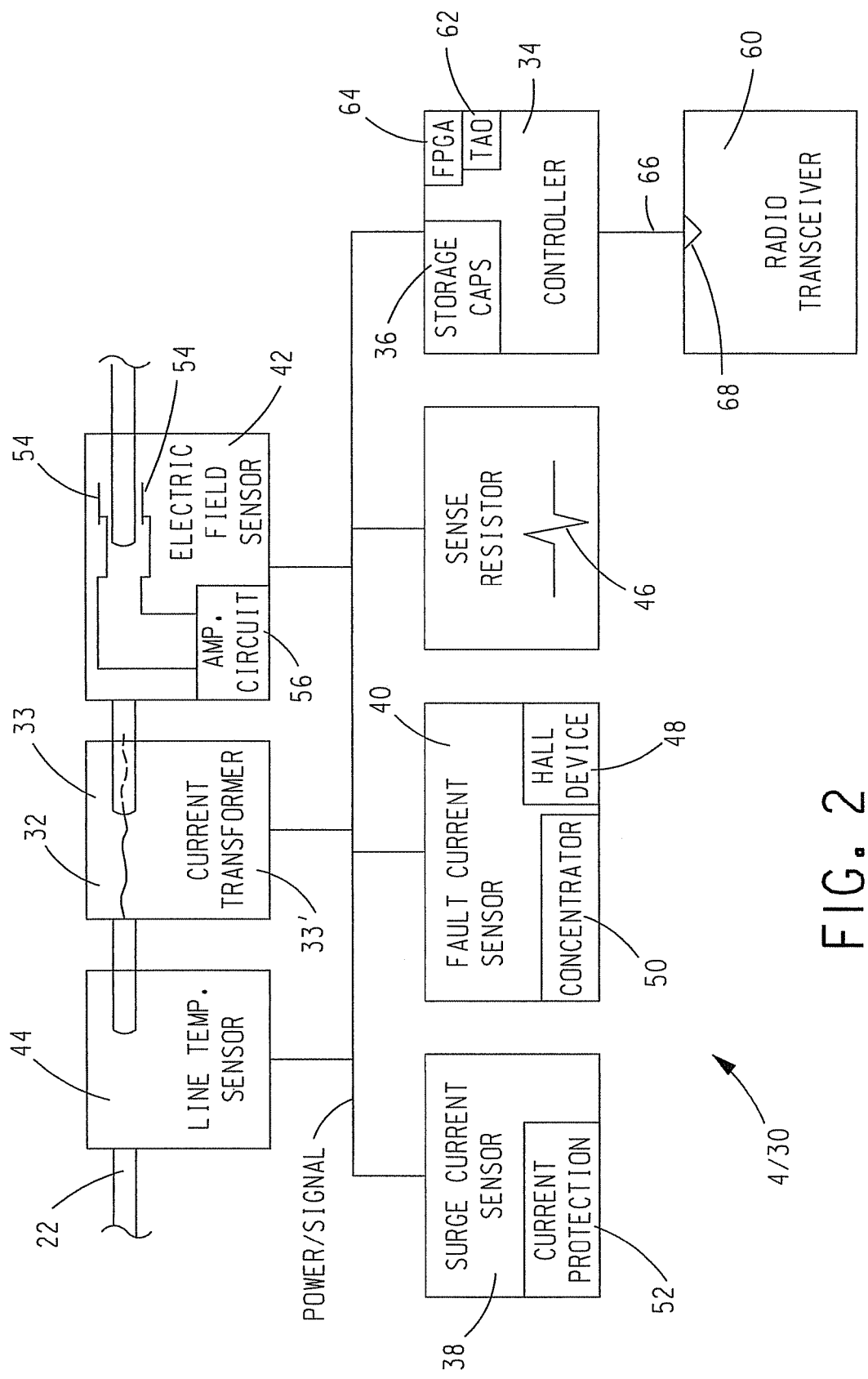
FIG. 2 is a block diagram of a one of the power line mounted monitors (MMP 4) shown in FIG. 1.

With reference to FIG. 2 and with continuing reference to FIG. 1, each MMP 4 comprises a Power Take Off (PTO) assembly 30 that performs the following functions.

Inductive/electromagnetic coupling to power line 22;

Provides automatic ranging of the coupled current;

Stores a reserve of power;

Senses the current flow in the power line;

Provides protection against current surges; and

Couples Power Line Carrier Communications (PLCC) transmit/receive signals to/from the power line.

Each PTO assembly 30 inductively couples power from the distribution line by means of a current transformer (CT) 32, which supplies power to the MMP 4. CT 32 utilizes a magnetic core that can be mechanically separated into two separated sections 33, 33' during installation of MMP 4 on power line 22. During normal operation, core halves 33, 33' are positioned (clamped) together to complete the magnetic circuit and to couple the MMP 4 to the power line 22. The properties of the magnetic core are selected such to allow all PTO functions to operate simultaneously.

CT 32 is wound with a multi-tap coil so that the best coupled current range can be selected by a controller 34 of MMP 4 for operation. This allows for rapid startup of MMP 4, operation over a greater current range, and limits thermal excursions, thus prolonging the life of MMP 4.

MMP 4 includes storage capacitors 36 for storing electrical power that can be utilized to power MMP 4 in the event of a power outage event. This allows MMP 4 to report power outages, and to maintain critical data such as pre/post event waveforms, meshing profiles, etc.

MMP 4 includes surge protection for preventing damage to MMP 4 during high current faults, such as those caused by a faulted conductor, insulator arcing, nearby lightning strikes, etc. It also provides protection during switching of the multi-tap CT 32.

PLCC can be used to communicate to other MMPs 4 or LMPs 2 as part of a mesh network and/or to any other device enabled with a compatible PLCC capability. Desirably, however, each MMP 4 utilizes a wireless network, described in greater detailed hereinafter, to communicate to other MMPs 4 and Aggregator 6 via a best path/medium.

Internal Sensing Elements.

Each MMP 4 includes a fault current sensor 40, an electric field sensor 42, and a line temperature sensor 44 for measuring various parameters of power line 22 such as power line current, electrical field, and power line temperature. The output of these sensors can be input into controller 34 and used by controller 34 for detecting outages, current transients, voltage-current phase differences, predict equipment failure, etc. Also, the various measurements can be analyzed to verify the performance of MMP 4 and calibrate some of the sensors.

Desirably, there are at least three types of current sensors employed in MMP 4. As noted above, PTO 30 senses current via CT 32. CT 32 generates a current from the power line current, determined by the turns ratio of CT 32, which produces a voltage drop across a sense resistor 46. By sampling the voltage drop across sense resistor 44 at multiples of the power line frequency, a waveform can be generated and an RMS value of the power line current calculated which can also be analyzed for harmonic content.

The second current measurement, performed by surge current sensor 38, is a peak detect & hold which can used to capture the magnitude of fast transient events, and which can also used as to verify the RMS current in power line 22. The peak current value can be compared to a preset current threshold to trigger event logging.

The third current measurement, performed by fault current sensor 40, is a measurement of the power line current via a linear Hall device 48. Hall device 48 is used in conjunction with a Hall concentrator 50 which negates the effects of a varying distance to the center of power line 22. This is required since MMP 4 is capable of attaching to a wide range of power line 22 conductor diameters. Hall device 48 is typically used to measure fault current at magnitudes which may saturate CT 32 or trip a surge protection 52 associated with surge current sensor 38 thus affecting the accuracy of the CT 32 current reading.

Since Hall devices are typically sensitive to environmental conditions, such as temperature, stress, etc., Hall device 48 is constantly calibrated using the CT 32 RMS current reading as a reference. A second Hall device may be included without a Hall concentrator, to increase the range of fault measurement. While different power line 22 conductor diameters will introduce an error term, a measurement indicating the magnitude of current is achievable by the second Hall device.

Electrical field is sensed via parallel spaced conductor plates 54 of electric field sensor 42. A voltage difference is generated by positioning plates 54 relative to power line 22 conductor and this voltage difference measured by a high impedance amplifier circuit 56. By measuring power line current and electrical field simultaneously, the difference can be measured and the relative voltage and current phase (reactive power) can be determined.

A line temperature sensor 44 is mounted in close proximity to power line 22 conductor so that the temperature of the conductor can be determined.

Processor 34 controls the selection of the appropriate tap of CT 32, the measurement of the voltage across sense resistor 46, the measurement of the output of surge current sensor 38, the measurement of the output of fault current sensor 40, the measurement of the output of electric field sensor 42, and the measurement of the output of line temperature sensor 44 under the control of a software program that also directs the operation of processor 34 to implement the mesh network and transmit data to and from other MMPs for and/or Aggregator 6 in a manner to be described next.

Mesh Network.

MMPs 4 implement a "mesh" network under the control of the controller of each MMP 4 operating under the control of a software program that causes each MMP to function as both an endpoint and a potential forwarder, with no prior configuration. This means that each MMP 4 must learn about other MMPs 4, and the pathway to Aggregator 6, by listening to messages received over-the-air via a radio transceiver (RT) 60 of MMP 4. Each MMP 4 is constrained by availability of power since it gets its power from power line 22 to which it is clamped and since such power is not constant and has a real lower boundary of 0. Since transmission of wireless radio messages via radio transceiver 60 requires substantial electric power, the mesh network desirably relies on as few message transmissions as possible. This becomes even more critical in power outage events, where MMP 4 has a fixed amount of energy available in storage capacitors 36 and must be able to reliably communicate its loss-of-power status to the network (parts of which are likely also to be experiencing the outage). But the underlying wireless transmission protocol has no ability to avoid, or even to detect, message "collisions"—it simply implements a random back off/retransmit scheme when a message fails to be delivered, resulting in a potentially large number of messages (and therefore transmission energy) being wasted, especially when the number of network nodes is large and many are experiencing an event such as an outage. So each MMP 4 implements a time-based mechanism, e.g., time-division multiplexing (TDM), whereby each participating node is assigned a time-slot during which it has the exclusive right to transmit, thereby sharing the available wireless bandwidth among all the participating nodes, without need for passing around a 'transmit token' or relying on randomized retransmissions to avoid collisions. How each node joins the network, learns about the available network paths to the Aggregator, and determines when it is it's turn to transmit, is described hereinafter.

In the mesh network described herein, the basic message timing unit is a 50 millisecond time slot or 'tick'. The MMPs 4 in a given network will all synchronize their 50 ms tick timers to that of the corresponding Aggregator 6. Synchronization between MMPs 4 and between MMPs 4 and Aggregator 6 is taken care of at a lower layer, so the smallest unit of time necessary to consider is the 50 ms tick. Aggregator 6 and the MMPs 4 are operative for assigning a number to each tick, from 0 through N−1, where N depends on the number of nodes (MMPs 4 and Aggregator 6) supported by the mesh network. After N ticks have elapsed, the cycle restarts at zero and repeats. This fundamental sequence of ticks is called the Beacon Cycle. The Beacon Cycle provides every node in the network with a specific time (tick number) for transmission of any messages it has to send. In one exemplary, non-limiting embodiment, the network size is limited to 50 nodes. For the purposes of describing the present invention, it will be assumed that the network size is 50 nodes. However, this is not to be construed as limiting the invention.

The Beacon Cycle is implemented in the form of a table, maintained by each node (MMP 4 and Aggregator 6), which maps a specific tick number to the node permitted to transmit during that tick, and the message type permitted to be sent. Instead of using actual node IDs, (which are unknown when the network first starts up), the Beacon Cycle table refers to nodes by a slot number. Each slot number is a number from 1 to 50, and is assigned to each node as it joins the network. Slot number 0 is desirably reserved for Aggregator 6.

There are two fundamental message types in the MMP wireless mesh network: Beacon messages and Data messages. Beacon messages are broadcast; that is, they are transmitted by one node, e.g., Aggregator 6, and delivered to all nodes, e.g., MMPs 4, that can receive the Beacon message correctly. Data messages are unicast; that is, they are sent by one node and specifically addressed to another node. If the other node receives the message correctly, it responds with an acknowledgement so that both the sender and the receiver will know that the message was delivered. There is no acknowledgement in the broadcast case because there can be potentially more than one receiver. Beacon messages include, among other things, the following data:

The ID (MAC address) of Aggregator 6;

A time-stamp (a 32-bit integer supplying a standard wall-clock time);

Path quality information for the path back to Aggregator 6;

The latest Beacon sequence number sent by Aggregator 6, as known by the sender;

The age of the sequence (how long ago this sequence was heard by the sender); and The tick number during which this Beacon message was sent.

Data messages include data from an MMP 4, such as current measurements and fault data. They can also include command and response messages from/to Aggregator 6, and other kinds of data such as firmware images being uploaded.

In a 'brand new' MMP network, before any nodes have joined, the only type of message being transmitted is a Beacon, which is being transmitted by Aggregator 6. The Aggregator Beacon is always transmitted during tick 0; hence, the transmission of the Aggregator Beacon signifies the start of a new Beacon Cycle. The timing of all other messages in the network is ultimately based on when the Aggregator Beacon is sent. The Beacon Cycle table dictates what messages can be sent during any particular tick. So, once the Aggregator Beacon message is sent, that becomes tick 0 and the timing for all other network messages is now known by all the other nodes (MMPs) that hear the Aggregator Beacon. The Aggregator Beacon will be sent again after N ticks (e.g., 50 ticks), and the whole cycle repeats.

The Beacon Cycle table allocates five kinds of messages, and prescribes when they can be sent:

The Aggregator Beacon, which is always sent at tick 0;

Beacons generated by MMPs 4 which have been assigned a slot;

Aggregator 6-generated data messages, called Outbound data messages;

MMP 4-generated data messages, called Inbound data messages; and

Inbound messages from MMPs 4 that are not yet assigned a slot ("unassigned" block)

Except for the last category, messages can only be sent by Aggregator 6 or by MMPs 4 that have been assigned a 'slot'. To get a slot, the MMP must first 'join' the network.

Joining the Network.

To join the network, an MMP 4 first listens for one or more Beacon messages output by Aggregator 6 (remember that Beacons are broadcast, meaning that any RT 60 can see them). Because all Beacon messages occur at tick number 0, the receipt of any Beacon is enough to set the timing for the MMP 4. In other words, having received at least one Beacon message, the MMP 4 now knows where the network is in terms of the Beacon Cycle, and so it now knows when all the other nodes are allowed to send, and so on. In particular, it knows when the "unassigned" block of ticks will next occur. Having listened for Beacons long enough to have completed at least one Beacon cycle, the MMP 4 now decides on the best path to use to get a message to Aggregator 6. This decision is based on the path information that can be included in each Beacon. In the case where this is a 'new' network and Aggregator 6 is the only node operating within radio range, the choice is obvious; MMP 4 will send messages directly to Aggregator 6. If MMP 4 listens for longer than a Beacon cycle and does not receive any Beacon messages, it cannot send any data—both because it does not know any address to send data to, and also because it does not have any timing data to know when to send its messages. In that case, MMP 4 will simply keep listening for Beacon messages. It could be that the Aggregator Beacon messages was missed, or it could be that other nodes have to be installed first, before this node becomes reachable.

Having determined in this example that Aggregator 6 can be reached directly, MMP 4 then sends its first data message to Aggregator 6. MMP 4 will know the Aggregator's 6 MAC address, because that is included in every Beacon received by MMP 4. MMP 4 will also now know the time-of-day to within one second, which will give it a time reference to use to time-stamp its data. These initial data messages will include the most recent data acquired by controller 34 from one or more of sensors 38, 40, 42, and/or 44, plus configuration information. In the case of a newly-installed MMP 4, the configuration information will be minimal, because the device has not yet been fully configured. The MMP 4 sends its initial data message during the "unassigned" tick block. It picks a random tick number within that block, so that in the rare case where two MMPs 4 are attempting to join the network at the same time, the randomization will separate the messages temporally, allowing both to get through. Because the data message is unicast, the MMP 4 will receive an indication via its radio transceiver 60 from Aggregator 6 whether Aggregator 6 received the message. If radio transceiver 60 receives from Aggregator 6 an indication that the message was successfully received, MMP 4 will then wait for configuration information (including a slot assignment) from Aggregator 6. If radio transceiver 6 receives from Aggregator 6 an indication that the message failed or if no message is received from Aggregator 6 in response to the first data message output by MMP 4, then MMP 4 waits for the next Beacon Cycle to retransmit, again choosing a random tick within the "unassigned" tick block.

Once Aggregator 6 hears the initial data message from MMP 4, it assigns MMP 4 a slot. It does this by sending a (unicast) data message to MMP 4, with retransmissions as necessary. Once MMP 4 receives its slot assignment, it no longer uses a random tick from the 'unassigned' block; instead it now has its own slot number (from 1 to 50), and the Beacon Cycle table of MMP 4 will tell it when to transmit messages. The Beacon Cycle table includes one entry per cycle (for each slot) that is dedicated to sending Beacons. Accordingly, each newly-configured MMP 4 will now begin sending its own Beacon message during the appropriate tick. The table also includes several ticks dedicated to Data message traffic, and one tick that can be used to send a second Beacon message or a Data message.

The Beacon message that is sent by each MMP 4 includes header information in the same format as that of the Beacon message that is sent by the Aggregator 6, including the time-of-day stamp, the Aggregator's 6 MAC address, and the sequence information. However, the path-quality information will be updated to include the MMP 4. For example, one of the path-quality fields is a "hop-count", which is the number of hops, or forwarding nodes, an inbound Data message sent by this MMP 4 will experience before ultimately arriving at Aggregator 6. When MMP 4 determines the best path for it to use to send Data messages to Aggregator 6, it makes a note of the hop-count along that best path and then adds one to the count for use in transmitting its own Data message. An MMP Beacon message is an advertisement to any MMPs 4 that can hear it, that the sending MMP 4 can forward messages to the Aggregator 6 with the indicated path quality. So, when a newly-powered-up MMP 4 is ready to join a network, it can look at the path-quality fields from all the Beacon messages it hears, and choose the best path to use based on these values. In the present example, and for the first MMP 4 to be attached to power line 22, the only choice was the direct path to Aggregator 6 itself; but in general there will be multiple paths to choose from, one for every MMP 4 in the network within radio range. Also, the path-quality information can change from one Beacon cycle to the next; for example, if a new MMP 4 were to join the network and present a better path back to Aggregator 6. Accordingly, the Beacon message sent by any MMP 4 includes its most recent estimate of the path-quality back to Aggregator 6, and all the MMPs in the network are constantly updating their path-quality information.

Forwarding.

Once an MMP 4 has joined the network, it begins regular transmissions of its Beacon message thereby informing other MMPs 4 in range that it is available for forwarding of Inbound Data messages to Aggregator 6. Desirably, an MMP 4 that has joined the network can transmit a Beacon message during an instance of its assigned time slot or 'tick'. However this is not to be constructed as limiting the invention. This means that an MMP 4 can receive a message bound for Aggregator 6, and it will put that message into its transmit queue and send it to the next node (another MMP 4 or Aggregator 6) along its preferred path, whenever it is permitted to send messages by the Beacon Cycle table, e.g., during its assigned time slot or 'tick'. This process is called 'forwarding'. Note that all Inbound Data messages are destined for Aggregator 6—meaning that the process for choosing the best 'next-hop' node to send the message to is the identical process as that used for sending the MMP's 4 own inbound data messages. That is, the path selection process is based on path-quality data included in received Beacon messages. And, as is the case for locally-generated messages, the path selection for forwarded messages is constantly subject to change as new Beacon messages are received.

Like the path-quality fields in Beacon messages, Inbound Data messages include header fields that describe the 'reverse' path quality. Each MMP 4 along the inbound data message path updates reverse path-quality header fields by merging its own data in, just like it does for Beacon messages. This includes, for example, the hop-count, which is the actual number of hops that the inbound message experiences along its path to Aggregator 6. Every time a message is forwarded, its hop-count field is incremented. In this way, Aggregator 6 ultimately receives, along with each Data message, a header that indicates the quality of the path back to the originating MMP 4. So, while Beacon messages are used by each MMP in the network to determine the best inbound path to the Aggregator, incoming data messages are used by each MMP 4 and the Aggregator 6, to determine the best outbound path to every MMP 4. When Aggregator 6 receives the first configuration-request/initial data message from a new MMP 4, it automatically already has the path information telling it how best to send back to that MMP 4. As more messages come in from that MMP 4, Aggregator 6 will update its routing table to reflect the best currently-known path to that MMP 4. The other MMPs 4 in the network will also maintain reverse-path information, to each endpoint MMP 4 that sends a message through them. Note that the only way an MMP 4 will have any routing information for a given endpoint node, is if that endpoint node has sent an inbound message that was forwarded by the MMP 4. So, although the network can be as large as 50 nodes, any given MMP 4 might only have routing information for a few of them. This is not a problem, because all Data messages are either inbound (where Aggregator 6 is the destination) or outbound (where Aggregator 6 is the source). In other words, peer-to-peer messaging is not supported, unless it can be done without any forwarding.

An exemplary message routing structure will now be described with reference to FIG. 3.

Figure 3:
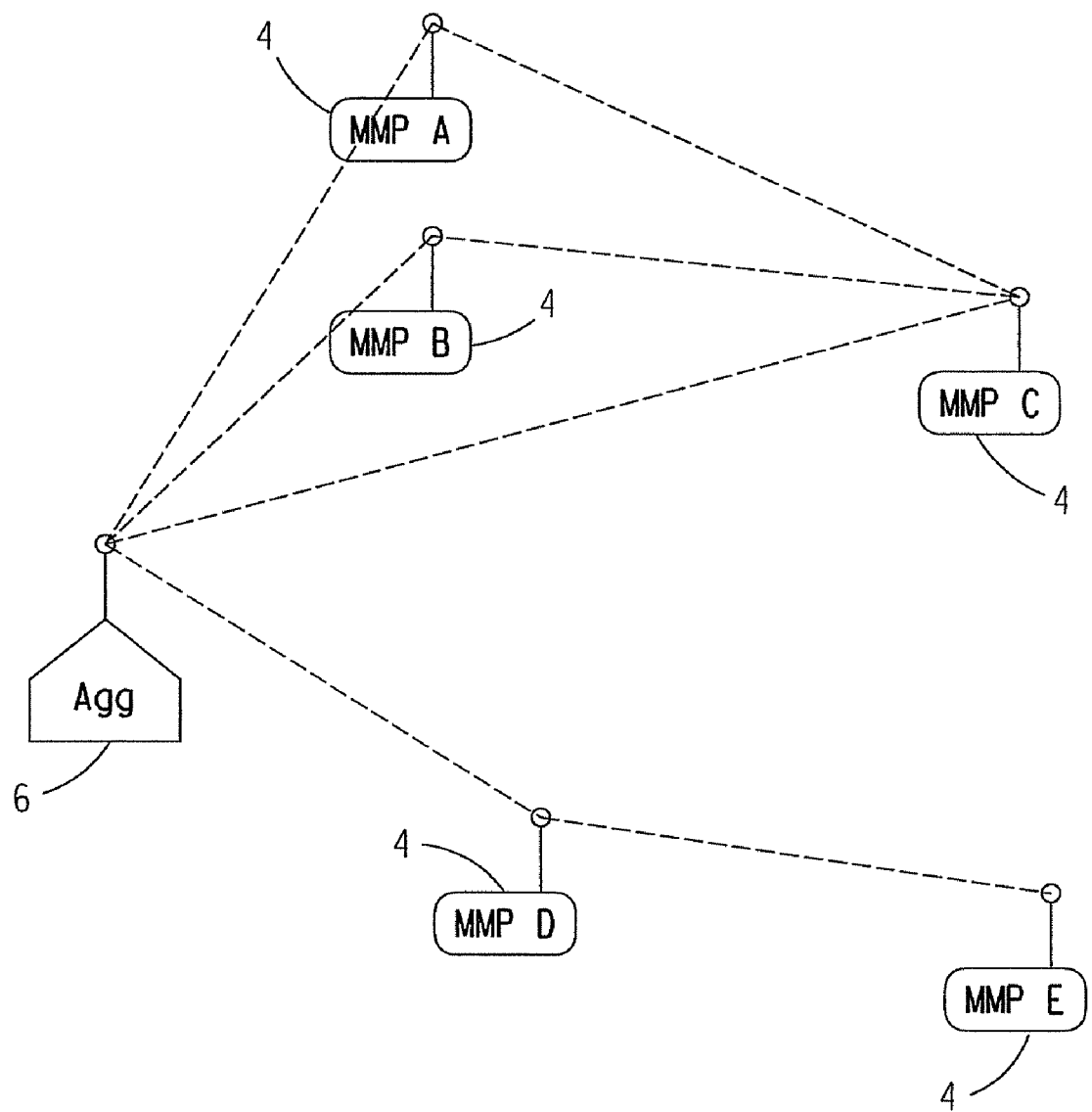
FIG. 3 is a diagram showing exemplary communication paths between MMPs, namely, MMP A, MMP B, etc., and an Aggregator.

In FIG. 3, MMP 4 nodes A, B, C, and D can all hear Beacon messages from Aggregator 6 directly. MMP node E can only hear Beacon messages from node D, and so it has only one choice to send Inbound data messages. MMP node C can choose to send its inbound Data messages to either node A or node B for forwarding to Aggregator 6, or it can send them directly to Aggregator 6. Note that although the 'direct' route involves fewer hops, other path-quality factors might make a one-hop route more desirable. Over time, MMP node C may try all three of these paths as conditions change. As it does, Aggregator 6 will learn that it can reach MMP node C via MMP node A, MMP node B, or directly. Meanwhile MMP nodes A and B will also learn that they can reach MMP node C directly. When Aggregator 6 has an outbound message to send to MMP node C, it can choose the best path among the three available. If it chooses to send the message through MMP node A, MMP node A will remember that it got inbound messages directly from MMP node C, and hence it will know the path back to MMP node C. Note that MMP nodes A and B do not know how to reach MMP node E. This is not an issue because Aggregator 6 will never try to send messages for MMP node E, through either MMP node A or B. MMP nodes A and B also have no reason to ever originate any message to MMP node E.

Slot Assignment.

By default, Aggregator 6 assigns slots in numeric order as each new MMP 4 joins the network. This assignment is done via a configuration message, which is an outbound Data message sent by Aggregator 6 specifically to the MMP 4 joining the network. Once the MMP 4 receives its slot assignment from Aggregator 6, it keeps that slot indefinitely, unless one of the following events occurs:

Aggregator 6 sends it a new slot assignment.

MMP 4 reboots.

Aggregator 6 ID (MAC address) changes (that is, the MMP begins receiving Beacon messages that were originated by another Aggregator 6). This would happen if the MMP 4 is removed from the line and installed at another location, before its stored energy runs low enough to cause a reboot.

The continuously-increasing Aggregator Beacon Sequence is interrupted. Each Beacon output by Aggregator 6 includes an Aggregator Sequence number which is a 16-bit field that the Aggregator 6 increments every time it sends a new Beacon message. If a Beacon message is received with an out-of-order sequence, it is an indication that Aggregator 6 may have restarted, and so all the MMP's in the network drop their slot assignments and request new ones. An 'age' field, also sent by Aggregator 6 with the Beacon message, is used as a qualifier for the sequence. If it comes time for an MMP to send its Beacon message, but in the previous Beacon Cycle it has not received any Beacon messages, it resends the same sequence number, but increments the Age. This can happen due to noise or congestion of the airwaves. Thus, if an out-of-order sequence number is received, the node (MMP 4 or Aggregator 6) can determine from the Age field if the data included in the Beacon message is actually newer than the sequence data it already has. If it is not newer, then the received Beacon message can be discarded for purposes of examining the sequence number.

The slot assignments made by Aggregator 6 are stored in a configuration file. This file is read in by Aggregator 6 in case of a restart, so that each MMP 4 will normally receive the same slot assignment that it had before the restart. This file can also be edited manually, to implement different ordering strategies.

Message Timing in the MMP.

The messaging system implemented by an MMP 4 is based on a 50 ms basic time unit, which is referred herein as a 'tick'. This time unit was chosen because it is also a standard 900 MHz radio hop rate; that is, the radio transceiver 60 will stay on each frequency for 50 ms before hopping to the next frequency. 50 ms is also enough time for the radio transceiver 60 to transmit a complete message of maximum size (127 bytes), although the message size actually used in an MMP 4 is 120 bytes.

The 50 ms timing is available on an MMP via a Timer A Output (TAO) pin 62 of controller 34. The output of this pin drives an input to a FPGA 64 of controller 34 which then uses it to control timing of serially transmitted data to radio transceiver 60 of MMP 4.

In order for the 'mesh' network to function in an orderly manner, all MMPs 4 on the same network must synchronize their 50-ms basic time ticks with each other. That is, the TAO signals of all the MMPs 4 in the network must be in phase with each other, to within a millisecond or so. This allows the 'airtime' to be divided up into distinct 50-ms ticks with no overlap, so that the sending of messages can occur in a back-to-back fashion from multiple MMPs 4 without interfering with each other. In order to accomplish synchronization, each MMP 4 has the ability to make small adjustments to the length of individual 50-ms ticks, thereby providing a means to change the phase of an individual TAO clock relative to another one in the network.

Figure 4:
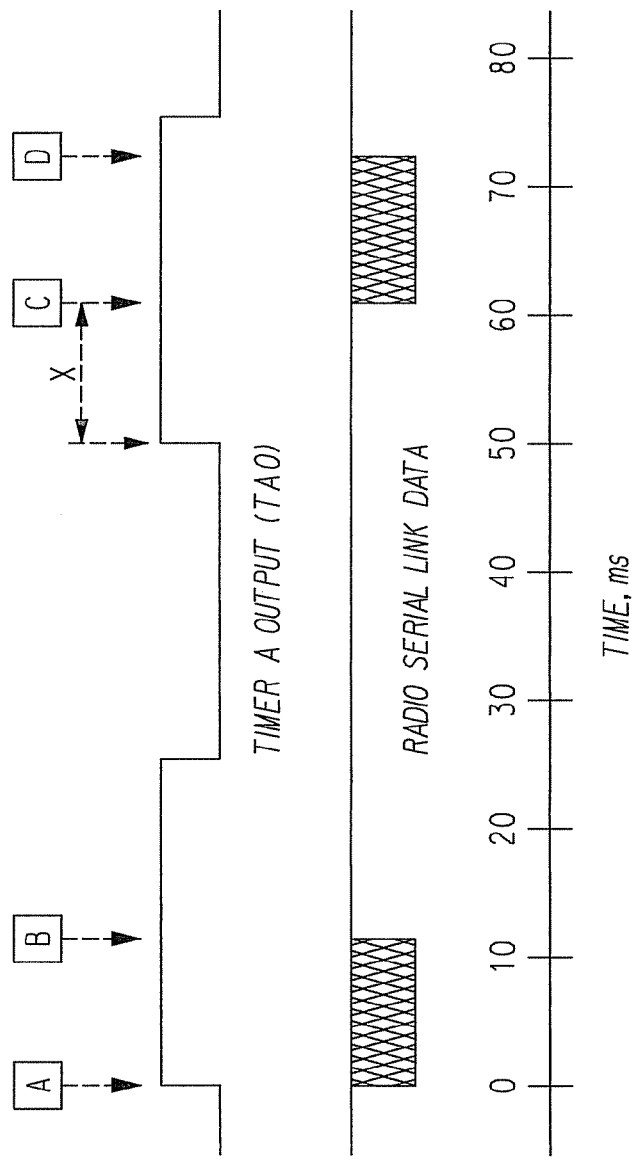
FIG. 4 is a timing diagram for transmitting a message from one MMP to another MMP.

With reference to FIG. 4 the basic timing of the signals involved is shown. When an MMP 4 has a message to wirelessly transmit, the complete message is first placed into a buffer in a memory of controller 34. Controller 34 then sends a command to FPGA 64 indicating there is a message to be sent. FPGA 64 then waits until the TAO 62 pin changes binary state, as shown at box A in FIG. 4, whereupon FPGA 64 begins transferring the message, via a serial link 66, to its radio transceiver 60. In the case of an MMP 4, the serial transfer desirably occurs at 115 kilo-baud, so for a 120 byte message with 7 extra "API" control bytes, the complete 127 byte packet is transferred, as shown at box B in FIG. 4, in about 11 ms (using 10 bit times per byte which allows for one start and one stop bit for each byte). Upon receiving the entire message at its serial input port 68, radio transceiver 60 immediately begins the over-the-air wireless transmission of the message. This transmission involves synchronization sequences, header, trailer, and error-correction bits, as well as an optional return-acknowledgement sequence from the target receiver. All of this takes place in 50 ms, during which time the sending MMP's 4 radio transceiver 60 dispatches a transmit-complete packet back to its FPGA 64, while the receiving MMP's radio transceiver 60 begins a serial transfer of the received message contents to its FPGA 64, as shown at box C in FIG. 4. At the receiving MMP 4, this transfer again takes about 11 ms and terminates at a time shown by box D in FIG. 4, since it includes the original 120-byte data message plus several API control bytes.

Desirably, the arrival of the first byte of the serially-transferred message at the receiver MMP 4 occurs a fixed amount of time, "X", relative to when the message was sent, which itself depends directly on the TAO signal at the sender MMP 4. By measuring the arrival time relative to the receiver MMP's TAO signal, and subtracting the known, fixed 11 ms of serial transfer delay, the receiver MMP can determine the difference in phase between its own TAO signal and that of the sender MMP. Once this measurement has been made, the receiver MMP simply adjusts the timing of its next TAO cycle by the inverse of the measured phase difference. Since all messages used in the MMP 4 wireless network are the same size (120 bytes of payload), the 11 ms timing value is fixed and does not depend on the type of message received. Therefore, every time any message is received by an MMP 4, it can adjust its timing "X" accordingly. Note that a newly-rebooted MMP will never send a message without first receiving one, and so even the first message received from a given MMP device can be used for timing purposes. Since Aggregator 6 generates its own timing (it does not do the timing measurement being described here), Aggregator 6 becomes the source of timing for the entire MMP network, as each MMP 4 device will automatically match its timing with that of Aggregator 6, or with that of another MMP 4 that, in turn, is synchronized with the Aggregator 6.

Routing in the MMP Network.

MMPs 4 and Aggregator 6 implement a 'mesh' network. Part of the procedure to join the network requires each individual MMP 4 to gather path-quality data from header fields in each of the Beacon messages it receives, for that path back to Aggregator 6. Similarly, MMPs 4 which are used as routers or 'forwarders' will also gather reverse path-quality data for the paths back to other endpoint MMPs 4 in the network from certain header fields in Inbound Data messages.

The path-quality headers are symmetric in the MMP network; that is, the same information fields are propagated outward (in Beacon messages) for the path back to Aggregator 6, as are propagated inward (in Inbound Data messages) for the path back to the originating MMP 4. The path-quality headers include the following data fields:

The number of hops to the destination.

The path signal-strength representing the lowest (weakest) signal strength along the path, to the destination, i.e., Aggregator 6 or endpoint MMP 4.

The path capacity. The capacity of an MMP 4 acting as a forwarder is the number of messages that the MMP can currently accept and queue for forwarding. As messages arrive, they each take up one queue position. The MMP's have only a limited amount of RAM available for queuing messages. This number goes down each time a message is received, and up each time a message is successfully transmitted. The path capacity is the lowest capacity among all of the nodes in the path to the destination.

The path Availability Factor. An MMP 4 can operate in 'low power' mode when the current in the line on which it is attached gets too low. One of the ways it manages its power usage in low-current cases, is to cycle power to its radio from time to time, to allow storage capacitors 36 energy to be restored while the radio is turned off. However, if this MMP 4 is used as a forwarder, then other MMPs in the network will be wasting energy by trying to send it messages when its radio is turned off. Hence, each MMP 4 computes an average Availability Factor, which means, roughly, the probability that the radio will be turned on at any given time, based on the present electrical current and storage capacitor's 36 charge condition. The path Availability Factor is the lowest (worst) Availability Factor among all of the nodes in the path to the destination.

For each of these data fields, each MMP 4 along the path updates the field with its own data, before forwarding the message. For example, for number of hops, each MMP 4 simply increments the value before forwarding the message. For the other three data fields, each MMP 4 compares its own local value against the value in the message header and, if its own local value is worse (weaker), then it replaces the value in the message header with its own value. Hence, by the time a Data message arrives at Aggregator 6, each of these data fields includes the worst-case values that were encountered along the path. Moreover, at every intermediate MMP 4, each of the these data fields includes the worst-case values that were encountered up to that point in the path, and so they represent the present conditions in the path back to the originator MMP 4 of the message.

Each MMP 4 (and the Aggregator 6 too), maintains a routing table that has one entry for each of the 50 possible other nodes (MMPs 4 and Aggregator 6) reachable in the network. Each entry includes a number of, e.g., up to four, possible forwarders (or next-hop nodes), that can be used to send a message to the given destination node. When a message arrives, the routing-table entry corresponding to the originator node of the message is accessed. If the MAC address from which the message was directly received, matches one of the forwarders in the entry, then the path-quality parameters are updated for that entry and that forwarder.

To determine the best next-hop MMP to send a message to for a given destination, the routing table entry for that destination is accessed. Each of the four next-hop nodes listed in the routing table entry is then evaluated by combining the data included in the path-quality headers associated with that next-hop node to determine a 'path rating' value, which is then used for comparing the forwarder (MMP 4) choices. The MMP 4 with the highest rating becomes the 'preferred' forwarder to the destination.

If there are four next-hop nodes represented in a routing table entry, and a message arrives from the routing table entry's destination via a new next-hop node, then the rating is calculated for the new next-hop node, and if it is higher than one of the four in the table entry, then the forwarder in the table is dropped and is replaced by the new one. In this way, each arriving message from a particular destination updates the routing-table entry for that destination in such a way that a new 'preferred' forwarder is determined, and the four best-available forwarders are always maintained.

Choosing the Forwarder.

When a message is ready to be transmitted, the MMP 4 has a choice of up to four next-hop nodes to send the message to, based on the routing table entry for the destination. MMP 4 makes this decision just before sending the message to its radio transceiver 60. If the message is successfully transmitted, then the signal strength to the node that it was sent to (which is provided in the Acknowledgement packet from the receiving nodes radio transceiver 60) is used to update the routing table entry in the transmitting node. If the message fails, then the MMP 4 updates its routing table entry to reflect the failure, and then puts the message back into its transmit queue to be sent again. This can happen repeatedly, up to a preset maximum number of retransmissions, after which the message is discarded. The MMP 4 evaluates the path-ratings of all of the potential forwarders each time the message is retransmitted so that retransmissions can sometimes take a different path than the original attempt. Although the routing table entry is updated every time a message is received, there is no guarantee that there will be new path-ratings available for each retransmission because there might not be an appropriate message received between retransmissions. For example, if an adjacent node suddenly goes out of service (maybe because it had to turn its radio off due to low power), there would be no indication of this locally, and the path-rating to that forwarder would not change, at least not immediately. The MMP 4 uses an algorithm that is designed to use the best available path most of the time, but when it fails uses one of the other paths. The way this algorithm works is based on the actual path-ratings and the number of retransmissions. If the packet has been retransmitted fewer than N/2 times, where N is the total pre-set number of retransmissions, then the MMP will use the preferred forwarder. But if the first N/2 transmissions have failed, then the MMP will use a randomization algorithm that chooses the forwarder using the path-ratings as probability weightings. For example, suppose the four forwarders available have path-ratings of 100, 50, 30, and 20. For the first N/2 attempts, the first forwarder will be chosen. For the rest of the attempts, a random choice will be made such that the first forwarder will be chosen 100/200 (or 50 percent) of the time, the second will be chosen 50/200 or 25 percent of the time, and the other last two, 15 and 10 percent respectively. This randomization ensures that even if a previously 'good' forwarder drops out, the packet will still be likely to be able to be forwarded. Note that even the randomization takes place every time the message is being sent, so that it always uses the most recently available path-ratings at the time of transmission, thereby being able to respond rapidly to changes in the network.

MMP Emergency Messaging.

As described, above the MMPs 4 implement a 'mesh' network. Part of the protocol to join this network involves the assignment to each MMP 4 of a time slot or 'tick'. This slot is when the MMP 4 is permitted to send various types of messages. Each node in the network is allocated a fixed amount of time during which it can send messages of its own origination or forward messages that were originated elsewhere.

In high-hop-count environments, the sending of messages across the network can be time-consuming and can use a lot of (distributed) power (each transmitted message consumes a non-trivial amount of power). In the case of a power outage, and a subsequent restore, the MMPs 4 need to send their power status as quickly and reliably to Aggregator 6 as possible. Such messages need to supersede any other 'normal' data messages in priority, because the utility operator will need to know about changes in power availability on a near-real-time basis in order for the MMP's 4 to be useful in outage management. Furthermore, at least in the case of a power outage, there is a very limited amount of energy in the storage capacitors 36 of each affected MMP 4, and this energy is not being replaced because there is no available current. Hence, the reliability of the message transport is critical, because there may be neither the time nor the energy to spend in multiple transmissions. Adding to the problem is the fact that multiple MMPs 4 in a single network are all likely to be affected simultaneously by an external condition such as a power outage. In such scenarios, there may be many units needing to send these high-priority messages at the same time, and comparatively little energy and time available to send them.

To address this, an "Emergency Messaging" mechanism is employed in the MMP network. An Emergency Message is a single byte (8 bits) that a given MMP can send quickly as soon as it decides it needs to. This very short message size is sufficient to communicate a code indicating what happened (for example, power went out, power came back on, current surged, etc.), but is small enough that multiple such messages can be carried in a single 120-byte packet. Specifically, Emergency Messages (E-msgs) are included in the Beacon messages in the MMP network protocol. Every Beacon message includes a 50-byte field corresponding to maximum number of MMP nodes supported in the network described herein, which is populated by the latest E-msg from each of the nodes. The 'slot' assigned to each MMP tells that MMP where to insert its E-msg in this 50-byte field. A zero byte indicates that the MMP assigned to that slot does not have any active E-msg. Each MMP maintains a local copy of the latest E-msg list as received from any incoming Beacon messages. If any E-msg entry changes, and the new value is nonzero, then this indicates that the MMP associated with that slot has issued a new E-msg. Once that is recognized by an MMP 4 it sends at least four outgoing Beacon messages including the nonzero E-msg, even if it is experiencing a loss of power.

This handling of E-msg fields results in new E-msg data being broadcast to every node in the network, and repeated several times by each node. Furthermore, since each Beacon message has room for all 50 nodes' worth of E-msg data, all 50 potentially active E-msgs can be carried in each outgoing Beacon message. Therefore, there is no additional network bandwidth or energy required to announce E-msgs from multiple nodes. For example, consider the network connectivity arrangement shown in FIG. 5.

Figure 5:
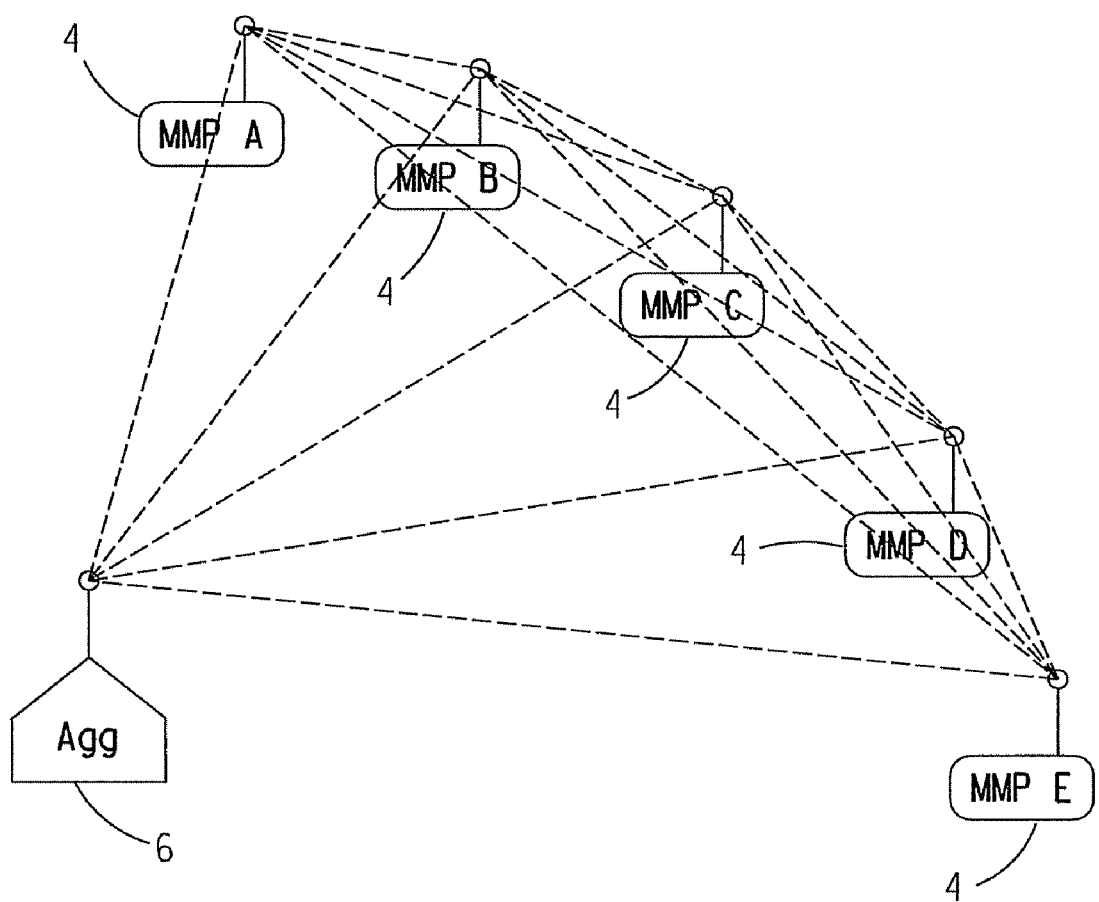
FIG. 5 is a diagram showing an exemplary communication paths for emergency messages during a power outage event on a power line, wherein the power outage event is experienced by less than all of the MMPs on the power line and all of the MMPs are within radio range of the Aggregator.

With reference to FIG. 5, assume the MMP's are assigned slots sequentially such that MMP A has slot 1, MMP B has slot 2, and so on. Now suppose there is a power outage that affects MMP C, MMP D, and MMP E. The next time any of these MMPs transmits a Beacon message, it will include an E-msg in its own slot. For example, assume that it is MMP C's turn to transmit a Beacon message. It sends its Beacon message with its E-msg attached, and this Beacon message is heard by all the other nodes, including MMP D. Now MMP D attaches the E-msg for MMP C, plus its own E-msg, to its next outgoing Beacon message. Again, this is heard by all the other MMP's, specifically, MMP E. MMP E attaches its own E-msg to its Beacon message, which now includes the E-Msg from MMP C, MMP D, and MMP E. When MMP E sends out its Beacon message, the entire network now sees all three power-outage messages. Aggregator 6, of course, also sees these Beacon messages, and so it informs sensor complementary system 8 of the outage.

Note that this communication uses no extra energy or network bandwidth, since Beacon messages would normally be sent by each of these nodes anyway. Also note that although only the case where MMP C was the next one to transmit a Beacon message, it would have worked equally well if any other node was next. It was assumed that every Beacon message transmitted is heard by all the other nodes, which doesn't always happen, due to random noise and interference. However, it can be seen that as long as some nodes hear any given Beacon message, the whole network will soon have heard all of the E-msgs.

Slot Ordering and Timing Considerations.

Figure 6:
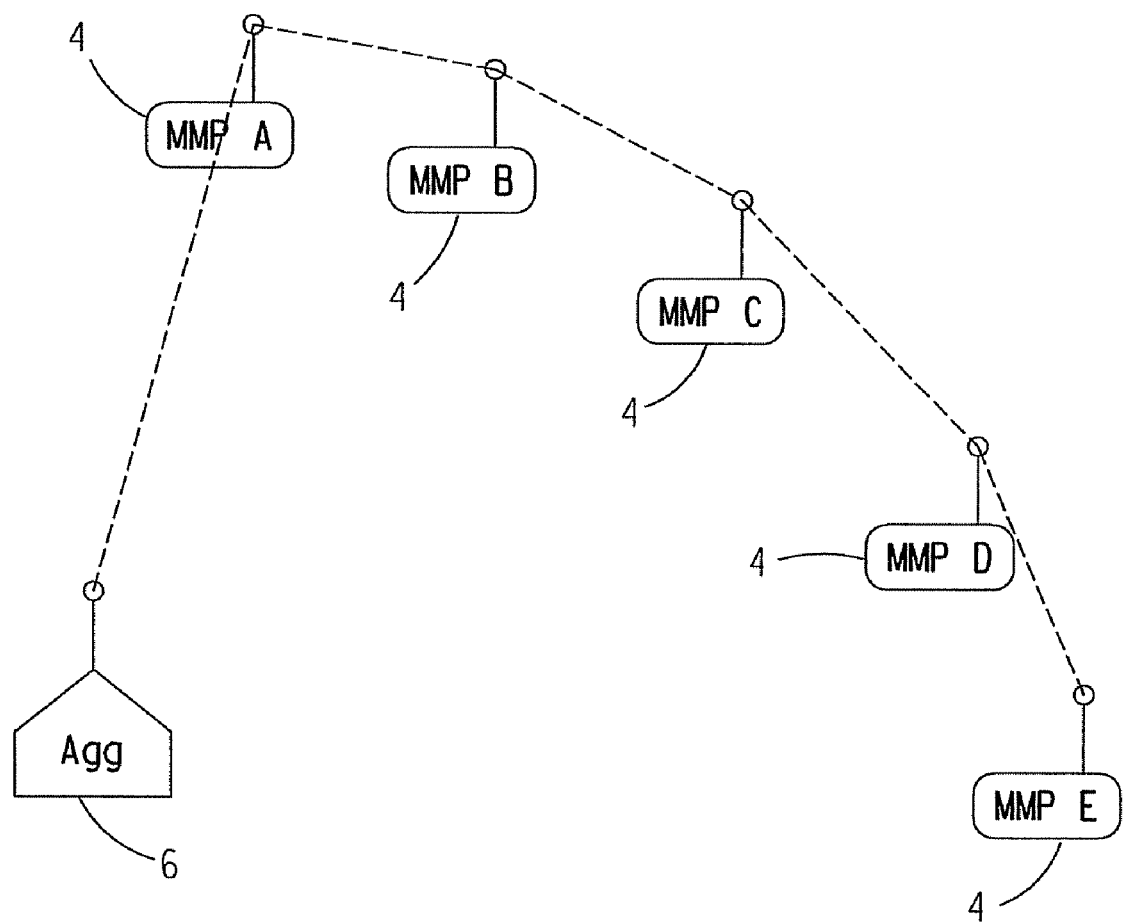
FIG. 6 is a diagram showing an exemplary communication paths for emergency messages during a power outage event on a power line, wherein the power outage event is experienced by less than all of the MMPs on the power line and all of the MMPs only in radio range with adjacent MMPs or, in the case of MMP A, with MMP B and the Aggregator.

The previous example assumed that all the nodes in the network were within radio range of themselves and the Aggregator. Now consider the other extreme, where the nodes are only within radio range of adjacent nodes:

With reference to FIG. 6, assume the MMP's are assigned slots sequentially such that MMP A has slot 1, MMP B has slot 2, and so on, and there is a power outage that affects MMP C, MMP D, and MMP E. The next time any of these nodes transmits a Beacon message, it will include an E-msg in its own slot. Assume that it is MMP C's turn to transmit a Beacon message. It sends its Beacon message with its E-msg attached, and this Beacon is heard by MMP B and MMP D. Now MMP D attaches the E-msg for MMP C, plus its own E-msg, to its next outgoing Beacon message. This Beacon messages heard by MMP C and MMP E. MMP E then attaches its own E-msg to its Beacon message, which now includes the E-Msgs from MMP C, MMP D, and MMP E. When MMP E sends out its Beacon message, only MMP D will hear it. So at this point MMP D and MMP E know about the full extent of the power outage; MMP C only knows about the outage at MMP C and MMP D; and MMP B only knows about the outage at MMP B. The next time MMP D sends its Beacon message, MMP C will then get the full picture of the power outage. Then, the next time MMP C sends its Beacon message, MMP B will have the full picture of the power outage, and so on. If, during each Beacon Cycle, every node gets only one chance to send its Beacon message, then it will take at least 5 Beacon Cycles for the full extent of the outage to reach Aggregator 6.

Since one of the design goals is to get the E-msgs to Aggregator 6 as quickly as possible, the performance outlined in the above scenario may be unacceptable. Even if the slot ordering (the ordering of the Beacon messages) were reversed, or otherwise rearranged, there is always some set of outage conditions that takes a maximum amount of time to be reported to Aggregator 6. To address this, the Beacon Cycle Table provides for each MMP 4 to send two Beacon messages; one in 'ascending' slot order, and the other in 'descending' slot order. Using the 5-MMP network example shown in FIG. 6, the Beacon Cycle Table would have the following entries:

| tick 00: | Aggregator Beacon |
| tick 01: | Primary Beacon for slot 1 |
| tick 02: | Primary Beacon for slot 2 |
| tick 03: | Primary Beacon for slot 3 |
| tick 04: | Primary Beacon for slot 4 |
| tick 05: | Primary Beacon for slot 5 |
| tick 06: | Secondary Beacon for slot 5 |
| tick 07: | Secondary Beacon for slot 4 |
| tick 08: | Secondary Beacon for slot 3 |
| tick 09: | Secondary Beacon for slot 2 |
| tick 10: | Secondary Beacon for slot 1 |

Of course, the Beacon Cycle Table would also reserve slots for Data messages, but they are omitted here for clarity. Using this type of arrangement for the "no cross-connects" network of FIG. 6, and sequential slot numbering for the MMP's 4, results in Aggregator 6 receiving all of the power outage information by the end of the first full Beacon cycle after the outage. This is much better performance and scales to the full network of, for example, without limitation, 50 nodes. However, there is still a problem if one assumes a random ordering of the slots assigned to the MMPs. In fact, one can construct a slot-numbering scenario for the "no cross-connects" network, that would create a worst-case time of (N−1)/2 Beacon cycles, for the full extent of an outage to reach Aggregator 6, where N is the number of nodes in the network. This is twice as fast as the single-Beacon cycle case, where the worst-case time would be (N−1) Beacon cycles, but it is still too slow. The best-case time is up to 2 Beacon cycles, but that only happens if the slot ordering is strictly 'ascending' or 'descending' with respect to the radio-connectivity. The MMP Network addresses this in several ways:

Most deployments are expected to have Aggregator 6 located physically at a substation. As MMP's 4 are installed, the installation order is recommended to start at the Aggregator and proceed outward. If this is followed, as each MMP 4 joins the network, it will be given the next sequential slot number, and so the 'ascending' ordering will happen as a consequence of the installation procedure.

If the network is brought completely down and restarted, Aggregator 6 will be the only node at first transmitting a Beacon message. Every MMP 4 that hears that Beacon message will then join the (new) network. All of these first-tier MMP 4 are, by definition, within radio range of Aggregator 6. After these MMPs 4 join, they start sending their own Beacon messages, and so then the second-tier MMPs 4 start to join. This has the effect of naturally creating the desired 'ascending' ordering of the slots, such that the furthermost MMPs 4 get the highest-numbered slots.

If the ordering does not produce the desired results automatically, it can be pre-programmed by MAC address into Aggregator 6. So if there was some 'trouble' network that required extra care with respect to slot ordering, the 'ideal' ordering could be determined manually (or by some software program), and then placed in an initialization file for Aggregator 6.

Effect of Dropped Packets.

The previous examples assumed that all Beacon messages that were transmitted were heard by one or more MMPs within radio range. In actuality, some of these Beacon messages are often not successfully received, due to interference, low signal level, synchronization issues, etc. In a worst-case scenario such as the 'no cross-connects' network example of FIG. 6, every time a Beacon message is missed by an MMP 4, it can cause the E-msg from one or more of the MMPs 4 to be delayed by a full Beacon cycle in reaching Aggregator 6. For this reason, MMP network planning desirably provides for 'overlap' wherever possible, so that instead of having only one adjacent node per MMP 4, there are at least two. In other words, each MMP 4 should have at least two choices for the 'next-hop' node on the path back to Aggregator 6. This would automatically be the case if three MMP's 4 were installed at each site (one for each phase of power line 22), which is the preferred architecture.

FHSS Radio Module Synchronization for the MMP Network.

This section describes a 900 MHz Frequency-Hopping Spread-Spectrum (FHSS) radio transceiver (RT) 60 that can be utilized in MMPs 4 of the MMP network.

Synchronization by Traditional Means.

The MMP Network is based on a 50 ms basic time unit, which is referred to herein as a 'tick'. This time unit was chosen because it is also a standard 900 MHz radio transceiver hop rate; that is, the radio transceiver will stay on each frequency for 50 ms before hopping to the next frequency. 50 ms is also enough time for the radio to transmit a complete message of maximum size (127 bytes), although the message size actually used in the MMP is 120 bytes. For overall architectural compatibility, each RT 60 will use the same 50-ms timing and packet size.

To synchronize a transmitting RT 60 and a receiving RT 60, a scheme is employed where the transmitting RT 60 chooses a random frequency on which to transmit a message. The transmitted message includes a synchronization portion and a data portion. The synchronization portion is a repeated pattern that the receiving RT 60 can recognize. The receiving RTs 60 constantly scan through all of the available frequencies (e.g., 50 frequencies) looking for a signal of sufficient level. If a signal is found, the receiving RT 60 stops the scan at that frequency and attempts to decode the signal to extract the bits. If the extracted bits include the synchronization pattern, then the receiving RT 60 has successfully synchronized with the transmitting RT 60. For the remainder of the packet, the receiving RT 60 will stay locked on that frequency and will decode the data bits when they arrive. If N bits are extracted (where N is the repeated synchronization pattern size) and the synchronization pattern is not found (beginning on any bit boundary) within the extracted data, then the receiving RT 60 goes to the next channel and resumes scanning.

In order to ensure that any receiving RT 60 will always see a synchronization pattern if one is being transmitted within radio range, the timing is arranged such that the synchronization pattern is short enough and repeats often enough that even if the receiving RT 60 'false triggers' on 49 channels before triggering on the correct channel, there is still enough time to reject each false channel and arrive at the correct channel before the synchronization portion of the packet is over. This means the sync pattern must be repeated at least 50 times, plus enough extra time to allow for changing frequencies and retuning. Shorter sync patterns mean that fewer transmitted bits will be necessary to send the pattern 50+ times. However, shorter patterns also mean increased risk of falsely recognizing a sync pattern. If the sync pattern is 8 bytes long, at least 400 bytes will be needed for synchronization, while the data portion of the packet is only 120 bytes, meaning that this method of synchronizing uses up nearly four times as many bits for synchronization as it does for data. Since bits transmitted correspond directly to energy required to transmit a packet, this synchronization method would use nearly four times as much energy as necessary to transmit the data.

Of course, a tradeoff can be made whereby the sync pattern is transmitted for a shorter period of time, and assume that potential receivers will not 'false trigger' on every channel. This sync pattern occupies about half of the transmitted packet, meaning that it is about 0.25 to 0.30 of the length it would have to be, to provide adequate sync time in the presence of noise on all the other channels. To put it another way, if a receiving RT 'false triggers' on fewer than 25 percent of the channels it scans, it will still have enough time to scan all of the channels and get to the one that is being transmitted on, before the sync period is over. To reduce 'false triggers', the sync level can be set to a desired level which is the db level below which the RT will not trigger. In higher noise environments with RTs in close proximity, the sync level can be increased to decrease the rate of false triggers and thereby increase the probability of successful synchronization. But this method still spends half of the transmitted bits (half the energy) on synchronization.

Although the random-transmit sync method described here requires extra transmit energy, it also has the advantage that any RT 60 can transmit at any time, and all RTs 60 within radio range of the transmitting RT 60 can theoretically sync to and receive the signal. There is no need for any history or prior arrangement between the sending RTs 60 and the receiving RT 60s. Furthermore, a sending RT 60 or receiving RT 60 can move in and out of range, or new sending RTs 60 can arrive and immediately become operative in the network. This is ideal for mobile devices, but it does not fit well for the MMP Network. An MMP Network includes up to, for example, without limitation, 50 nodes which are physically mounted and don't move once they are installed. It also implements a network that is strongly timing-sensitive. Nodes do not need to transmit on-demand, but rather they transmit in a controlled manner, with each node taking its turn in a carefully orchestrated sequence. When a new MMP is installed, the network is permitted to take some amount of time before the new MMP becomes usable (in contrast to, say, a wireless phone that has to be ready all the time for a call). Finally, the MMP's operate on very low current, and so transmit power is a scarce resource. To do reliable synchronization under the timing and power constraints of the MMP Network, the RT 60 takes an entirely different approach.

Synchronization in the RT.

The philosophy of synchronization in each RT 60 is that although synchronization may be more difficult to achieve, especially on receipt of a single packet, once it is achieved, it is retained for relatively long periods of time (much longer one packet's worth of time). This approach allows much less transmit energy to be spent on synchronization.

Each RT 60 maintains a 16-bit clock that continuously increments at a 20 Hertz rate (50 ms per clock cycle or tick). This clock is called the sync clock, and the 16-bit value is the sync number. The sync number is transmitted in every packet. If the same data is transmitted on two consecutive ticks, the packets would of course bear different (consecutive) sync numbers. The sync number also determines the frequency used to transmit the packet. The mapping between the 16-bit sync number and the channel number provides a pseudo-random sequence of channels, which should satisfy channel randomization requirements for frequency-hopping RTs. Once an RT 60 successfully receives any packet, it sets its own sync clock to the sync number received, so that all of the radios in the network will all have a commonly synchronized clock. Furthermore, the timing of the first bit of the packet data is always the same relative to the incrementing of the sync clock, so all of the nodes are able to be synchronized to an arbitrarily small timing error window. The key to long-term synchronization is that once the sync number is known, every frequency for every subsequent packet, is already established. So an RT successfully receives a packet, thereby becoming 'in-sync' with the network, and it can now transmit subsequent packets, knowing that all the other in-sync RTs in the network will be listening on the frequency that it will be using to transmit. Crystal frequencies should be accurate from one MMP to the next, to a sufficient degree to ensure a one-bit drift between any two nodes will take at least a few minutes. When an RT is in the 'synchronized' state, it tunes to the expected frequency and starts listening for the start of a new packet a minimum of 8 bit times before the packet is expected to begin; therefore the clocks of two RTs attempting to communicate, would have to drift apart by at least 8 bit times for loss of synchronization to occur; this would take a minimum of a few minutes. Of course, the receipt of any message within this time period would re-synchronize the receiver to the sender's clock. Therefore, as long as a radio receives any message at least once every minute or so, it never loses sync. The software in the RT monitors synchronization time, and if the RT ever experiences a period longer than this limit with no received messages, the software will automatically place the RT into the 'unsynchronized' state, meaning that it cannot send a message until it receives one.

Becoming Synchronized Initially

When an RT is in the 'unsynchronized' state, it must receive a message from the network in order to become synchronized again. Any valid network message will do, even if the message is unicast to some other receiver. But in the unsynchronized state, the RT does not know what frequency to listen on. Therefore a 'scan' mode is implemented, which attempts to find signal on any frequency by scanning rapidly through them (either sequentially or in a random order). If the RT finds digital data on a particular frequency that looks like it might belong to the MMP network, then it stays on that frequency and listens to the remainder of the packet. If it happens to have stopped on a frequency where there is a valid MMP network message being transmitted, then a single sequence of 'synchronization' will appear at the end of the packet. This is where the sync number is sent, as well as a network/system identification and some other bits that make this pattern unique and recognizable. Although the entire packet may not have been received, the pattern at the end of the packet gives the RT enough information to know the sequence of future packet frequencies, so it is now at least partially synchronized (in this state, the RT is synchronized but the radio is still not allowed to transmit, until a successful receipt of a complete packet).

If the RT had stopped on a frequency including digital data but not from the MMP network, then after a timeout (or after the data stops), the RT re-enters 'scan' mode and looks for another packet. If nothing more is done, this method of gaining 'first sync' will work, but might take some time, especially if the MMP network is not very busy. This is because in a non-busy MMP network there are not very many packets being transmitted, and finding one when not in-sync is a hit-or-miss proposition. The probability of finding a transmitted packet is very high if the noise level is low, but can be as poor as one chance in fifty if the noise is high. So theoretically, some 50 messages would need to be transmitted in the MMP network before the RT would be expected to be in-sync. Note that if the ambient noise is bad (as to cause false-triggers on every frequency) then the MMP network is not likely to work very well. More realistically, the RT might have to wait for 10 or fewer messages to be transmitted before hearing one and thereby gaining sync. To decrease this initial sync acquisition time, MMP units can transmit extra Beacons or extra data messages when they have plenty of energy to do so and when they notice that the network traffic is low. If one message is sent every 3 seconds on average, that means that a new, unsynchronized RT would be expected to gain sync within 30 seconds.

With all RTs 60 synchronized together, phase and power factor calculations of the power line 22 can now be made. As previously described, each MMP 4 can measure current flowing in the power line 2, including the zero crossing point of the current. By synchronizing each RT's 60 synchronization signal to the zero crossing of the voltage at the aggregator, each MMP 4 can compare the zero crossing time of the current to time of the synchronization signal to determine a time difference therebetween which, for a given frequency of electrical power delivery on power line 22, e.g., 60 Hz, is indicative of the phase relationship of the voltage on the power line 22 to the current on the power line 22. The power factor value can then be calculated by using the discrete current samples and known voltage zero crossing time.

The invention has been described with reference to the preferred embodiment. Obvious modifications and alterations will occur to others upon reading and understanding the proceeding detailed description. It is intended that the invention be construed as including all such modifications and alterations insofar as they come within the scope of the appended claims or the equivalents thereof.

The invention claimed is:

1. A power distribution monitoring system comprising:
   at least one power line mounted monitor including means for acquiring data regarding the delivery of electrical power in the power line, means for wirelessly transmitting and receiving messages, and means for electromagnetically acquiring operating electrical power from electrical current flowing in the power line; and
   an aggregator including means for wirelessly transmitting and receiving messages, said aggregator operative for wirelessly outputting beacon messages and for receiving monitor initiated messages wirelessly transmitted from each monitor, wherein, upon initially acquiring operating electrical power from electrical current flowing in the power line, each monitor is responsive to at least one of the beacon messages for wirelessly transmitting a first monitor initiated message to the aggregator which responds to the first monitor initiated message by wirelessly transmitting to the monitor a first aggregator initiated message that includes an assignment of the monitor to a unique communication slot of time of a time-based communication protocol that the monitor utilizes thereafter for wirelessly communicating subsequent monitor initiated messages to the aggregator.

2. The system of claim 1, wherein at least a subset of the monitor initiated messages includes the data regarding the delivery of electrical power in the power line.

3. The system of claim 1, wherein:
   the time-based communication protocol includes an first block of time slots and a second block of time slots;
   when initially powered with electrical power acquired from the power line, each monitor wirelessly transmits its first monitor initiated message during one of the time slots of the first block of time slots; and
   the unique communication slot of time is a unique time slot in the second block of time slots.

4. The system of claim 1, wherein, upon initially being powered, each monitor is operative for randomly picking a slot of time in the first block of time slots for wirelessly transmitting the first monitor initiated message to the aggregator in response to receiving the beacon message.

5. The system of claim 1, further including at least one intermediate monitor for storing and retransmitting messages inbound to the aggregator from the monitor or outbound from the aggregator to the monitor during a unique communication time slot assigned to the intermediate monitor by the aggregator.

6. The system of claim 5, wherein:
   each intermediate monitor includes a routing table;
   the routing table includes an identity of either the aggregator or another intermediate monitor to which the intermediate monitor retransmits aggregator bound messages; and
   the routing table includes an identity of another monitor to which the intermediate monitor retransmits aggregator initiated messages.

7. The system of claim 6, wherein:
   the routing table includes for aggregator bound messages the identity of (1) two other monitors or (2) the aggregator from which the intermediate monitor can select to retransmit messages;
   the routing table includes for aggregator initiated messages the identity of two other monitors from which the intermediate monitor can select to retransmit messages; and
   the intermediate monitor is operative for making each selection based on a path quality rating associated with the identity.

8. The system of claim 6, wherein the path quality rating is a function of:
   a number of intermediate monitors in a path to the aggregator for aggregator bound messages or a number of intermediate monitors in a path to a endpoint monitor for aggregator initiated messages; and
   a weakest signal strength along the path to the aggregator or the path to the endpoint monitor.

9. The system of claim 1, wherein, in response to detecting a loss of electrical power being delivered in the power line, each monitor includes in a message wirelessly output during its unique communication time slot data indicative of said power loss.

10. The system of claim 1, wherein, when not wirelessly communicating during its unique communication time slot, each monitor receives messages output by at least one of the following: the aggregator or at least one other monitor.

11. The system of claim 1, wherein each monitor includes a two-section magnetic core that is separated during installation of the monitor on the power line and brought together around the power line to compete a magnetic circuit and to mechanically couple the monitor to the power line, wherein the completed magnetic circuit is operable to electromagnetically acquire the electrical power from the electrical current flowing in the power line.

12. The system of claim 1, wherein the means for acquiring data regarding the delivery of electrical power in the power line includes at least one of the following:
   a sense resistor operative for outputting a voltage related to the electrical current flowing in the power line;
   a surge current sensor operative for detecting a peak magnitude of the electrical current flowing in the power line; and
   a Hall sensor operative for detecting the electrical current flowing in the power line.

13. The system of claim 1, wherein each monitor includes a controller operatively coupled to receive data from the means for acquiring data.

14. The system of claim 1, wherein each means for wirelessly transmitting and receiving messages includes an RF transceiver operating under the control of a controller.

15. The system of claim 1, wherein:
   the aggregator is operative for measuring zero voltage crossing on the power line and for synchronizing each means for wirelessly transmitting and receiving messages to said zero voltage crossing; and
   each monitor is operative for measuring zero current crossing in the power line and for determining a phase difference between the zero voltage crossing and the zero current crossing based on a time difference between said synchronization and the time the monitor measures zero current crossing.

16. A power distribution monitoring system comprising:
   a plurality of power line mounted monitors each of which includes means for acquiring data regarding the delivery of electrical power in the power line, means for wirelessly transmitting and receiving messages, means for controlling the operation of the monitor, and means for electromagnetically acquiring and storing operating electrical power from electrical current flowing in the power line; and
   an aggregator including means for wirelessly transmitting and receiving messages, and means for controlling the operation of the aggregator, wherein under the control of beacon signals wirelessly output by the aggregator, each monitor co-acts with the aggregator to dynamically build a wireless communication network for the wireless communication of the data acquired by the monitor regarding the delivery of electrical power in the power line to the aggregator.

17. The system of claim 16, wherein, in response to receiving a beacon message output by the aggregator after initially acquiring operating electrical power from electrical current flowing in the power line, each monitor wirelessly communicates with the aggregator and is assigned thereby a unique communication time slot of a time-based communication protocol that the monitor utilizes thereafter for wirelessly communicating with the aggregator.

18. The system of claim 17, wherein:
   when not wirelessly communicating during its unique communication time slot, each monitor is operative for receiving and storing one or more message output by at least one of the following: the aggregator or at least one other monitor; and
   the monitor is operative for forwarding the stored one or more messages during its unique communication time slot.

19. The system of claim 16, wherein
   the aggregator includes means for measuring zero voltage crossing on the power line and for synchronizing each means for wirelessly transmitting and receiving messages to said zero voltage crossing; and
   each monitor is operative for measuring zero current crossing in the power line and for determining a phase difference between the zero voltage crossing and the zero current crossing based on a time difference between said synchronization and the time the monitor measures zero current crossing.

20. The system of claim 16, wherein each monitor wirelessly communicates with the aggregator, and vice versa, either directly or via another monitor.

* * * * *